(12) United States Patent
Miller et al.

(10) Patent No.: US 6,380,628 B2
(45) Date of Patent: *Apr. 30, 2002

(54) MICROSTRUCTURE LINER HAVING IMPROVED ADHESION

(75) Inventors: John A. Miller, Newburgh; Andrew Simon, Fishkill, both of NY (US); Jill Slattery, Underhill, VT (US); Cyprian E. Uzoh, Milpitas, CA (US); Yun-Yu Wang, Poughquag, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/377,329

(22) Filed: Aug. 18, 1999

(51) Int. Cl.[7] .................. H01L 23/48; H01L 23/52; H01L 29/40
(52) U.S. Cl. ...................................... 257/762; 257/763
(58) Field of Search ................ 257/762, 763, 257/764, 765; 438/637, 675, 648, 665

(56) References Cited

U.S. PATENT DOCUMENTS

| | | | | |
|---|---|---|---|---|
| 5,290,731 A | * | 3/1994 | Sugano et al. | 437/174 |
| 5,754,390 A | * | 5/1998 | Sandhu et al. | 361/321.4 |
| 5,851,920 A | * | 12/1998 | Taylor et al. | 438/648 |
| 5,930,669 A | * | 7/1999 | Uzoh | 438/627 |
| 5,985,749 A | * | 11/1999 | Lin et al. | 438/623 |
| 5,998,870 A | * | 12/1999 | Lee et al. | 257/751 |
| 6,002,175 A | * | 12/1999 | Mackawa | 257/760 |
| 6,022,800 A | * | 2/2000 | Ho et al. | 438/643 |
| 6,025,624 A | * | 2/2000 | Figura | 257/306 |
| 6,657,236 | * | 5/2000 | Clevenger et al. | 438/680 |

OTHER PUBLICATIONS

W. M. Moreau, "Semiconductor Lithography Principles, Practices, and Materials", Chapter 8, General Technolgy Division, IBM Corp., Hopewell Junction, NY. (Mar. 1988).

* cited by examiner

*Primary Examiner*—Phat X. Cao
(74) *Attorney, Agent, or Firm*—Ratner & Prestia; Tiffany L. Townsend, Esq.

(57) ABSTRACT

A damascene structure, such as a conductive line or via, having a liner with a roughened surface between the substrate and the conductive fill and, preferably, a smooth bottom. The substrate underneath the liner may also have a roughened sidewall and smooth bottom. Such a structure provides enhanced adhesion between one or more layers of the damascene structure. The damascene structure may be manufactured by applying a photoresist over a substrate top surface, exposing the photoresist under conditions that create a standing wave in the resist, and developing the photoresist to provide a pattern having the desired roughened or serrated outline. The pattern is transferred into the substrate, the liner is applied over the substrate bottom and sidewalls, and the liner is filled with conductive material. A roughened liner surface may be achieved by applying a partial layer of liner material over the substrate, removing a portion of the partial layer, and repeating the application and removal steps.

12 Claims, 2 Drawing Sheets

MICROSTRUCTURE LINER HAVING IMPROVED ADHESION

TECHNICAL FIELD

The present invention relates generally to integrated circuits and, more specifically, to prevention of interlaminar de-lamination in chip wiring and packaging structures.

BACKGROUND OF THE INVENTION

Copper (Cu) is frequently used in chip wiring and packaging structures. Often, to prevent copper from contaminating the silicon or the dielectric in the device, a barrier layer is interposed between the silicon and the copper or between the dielectric and the copper. To maintain the structural integrity of the wiring structure, however, the adhesion between the barrier and dielectric and the barrier and the copper must be sufficient to survive subsequent processing.

Copper adheres poorly to most dielectrics and to some otherwise highly-desirable barrier films. As chip wiring ground rules continue to shrink, adhesion becomes an increasingly critical issue in chip fabrication, because the critical length for adequate adhesion and stress transfer within the wiring structure does not decrease monotonously with the dimensions of the lines and vias. For example, referring now to FIGS. 1 and 2, there are shown typical via and line structures of the prior art illustrating the critical parameters affecting adhesion.

Traditional fabrication processes for damascene structures, such as via 10 or line 20, comprise first depositing a suitable photoresist material (not shown) on a substrate 12, typically an insulator or dielectric such as an oxide, and then imaging the photoresist in a desired pattern of vias and lines. The photoresist image is then transferred onto substrate 12 by reactive ion etching (RIE) methods well known in the art. Via 10 and line 20 are then typically coated by a suitable barrier layer 14, after which the structure is filled with a suitable metal 30, such as copper, by electrodeposition, sputtering, or chemical vapor deposition (CVD) processes and the like, also well known in the art. Excess metal overburden (not shown) that may protrude above the surface 11 of substrate 12, after the deposition step, may then be planarized to produce the finished structures as shown in FIGS. 1 and 2.

As shown in FIGS. 1 and 2, a cylindrical conductive via 10 in substrate 12 typically has a diameter d and a height h. Circular bottom 16 has an area $A_b$ and cylindrical wall 18 has a circumferential area $A_c$. Thus, the surface areas of the interfaces between via 10, barrier layer 14, and substrate 12 can be expressed as follows:

$$A_b = \frac{1}{4}\pi d^2 \quad (1)$$

$$A_c = \pi d h \quad (2)$$

$$\frac{A_c}{A_b} = \frac{4h}{d} \quad (3)$$

When height h and diameter d are equal, i.e., when via 10 has an aspect ratio h/d equal to 1, the ratio $A_c/A_b$ is equal to 4. The ratio $A_c/A_b$ thus increases linearly with an increase in aspect ratio.

Also shown in FIGS. 1 and 2, line 20 has a width W a depth D and a length L. The corresponding line floor 22 has an area $A_f$ and the total sidewall area $A_w$ comprises the sum of the areas of the four walls 23 and 24 as follows:

$$A_f = WL \quad (4)$$

$$A_w = 2WD + 2DL \quad (5)$$

The corresponding ratio of line wall to floor area is thus:

$$\frac{A_w}{A_f} = \frac{2WD + 2DL}{WL} = \frac{2D}{L} + \frac{2D}{W} \quad (6)$$

Because L is much greater than both W and D, Equation 6 reduces to:

$$\frac{A_w}{A_f} \cong \frac{2D}{W} \quad (7)$$

Thus, for a line aspect ratio D/W equal to 1, $A_w/A_f$ equals 2. As the line aspect ratio increases, $A_w/A_f$ increases linearly.

FIG. 2 depicts the balance of stresses related to adhesion in via 10. Tensile stress $\sigma_v$ in force per unit area acting on conductive via 10 is opposed by adhesion stress $\tau_v$ in force per unit area such that:

$$\sigma_v\left(\frac{1}{4}\pi d^2\right) = \tau_v\left(\pi d h + \frac{1}{4}\pi d^2\right) \quad (8)$$

Equation 8 reduces to:

$$\tau_v = \frac{\sigma_v}{4\frac{h}{d} + 1} \quad (9)$$

Thus, for an aspect ratio of 1, $\tau_v = \sigma_v/5$.

Similarly, with respect to line 20, tensile stress $\sigma_L$ is opposed by adhesion stress $\tau_L$ such that:

$$\sigma_L WL = \tau_L(WL + 2WD + 2DL) \quad (10)$$

Equation 10 reduces to:

$$\tau_L = \frac{\sigma_L WL}{WL + 2WD + 2DL} \quad (11)$$

Again, because L>>D and L>>W, the following approximation may be used:

$$\tau_L = \frac{\sigma_L WL}{WL + 2DL} = \frac{\sigma_L W}{W + 2D} \quad (12)$$

Thus, where the line aspect ratio equals 1 (i.e., W=D), then $\tau_L = \sigma_L/3$.

If the adhesion stress $\tau_V$ exceeds the adhesion strength of any of the bonds between conductive via 10, barrier layer 14, and substrate 12, de-lamination may ensue. Similarly, de-lamination may occur if $\tau_L$ exceeds the corresponding adhesion strength of any of the bonds between line 20, barrier layer 14, and substrate 12. As described earlier, the adhesion strength of certain desired via and line materials, such as copper, to certain desired barrier layers or dielectrics may be relatively low. As the size of vias and lines are reduced, the surface area of the bonding surfaces also becomes reduced, whereas the adhesion strength and tensile stresses may be. the same. Hence, finer wiring structures may be exposed to increased interlaminar de-lamination or local separation of the dielectric or barrier layer from the metal structure of the vias or lines.

Thus, there is a need in the art for methods, structures, and processes of creating such structures to prevent interlaminar de-lamination.

SUMMARY OF THE INVENTION

To meet this and other needs, and in view of its purposes, the present invention provides a damascene structure extending into an insulating substrate, the structure having a sidewall and a bottom, a liner on the sidewall and the bottom, and a conductive fill on the liner. The improvement comprises the liner having a roughened surface in contact with the conductive fill. The roughened liner surface may comprise a serrated pattern along a longitudinal section parallel to the substrate surface, and may further comprise a serrated pattern along a cross section intersecting the substrate surface. The damascene structure sidewall may also have a roughened surface in contact with the liner, in particular a roughened surface that comprises a serrated pattern along a longitudinal section parallel to the substrate surface. The liner may have a smooth surface over the damascene structure bottom, which may be smooth itself.

The invention also comprises a process for fabricating a conductive damascene structure in a substrate. The process comprises applying a photoresist over the top surface of a substrate and exposing the photoresist using exposure conditions that create a standing wave in the resist during resist exposure. Upon developing the photoresist, a damascene structure pattern is revealed having a plurality of serrations extending in a longitudinal plane substantially parallel to the substrate top surface. The pattern is transferred to the substrate to create in the pattern a damascene structure having a bottom and serrated sidewall with a plurality of serrations along a longitudinal section substantially parallel to the substrate top surface. A liner is applied over the bottom and over the sidewall in the substrate. The damascene structure is then filled with a conductive fill over the liner.

The liner may be applied over the sidewall in the substrate such that the liner surface has a plurality of serrations along a longitudinal section parallel to the substrate top surface. The liner may further be applied over the sidewall in the substrate such that the liner surface has a plurality of serrations along a cross-sectional plane intersecting the substrate top surface. The roughened surface may be achieved by applying a partial layer of liner material over the substrate, removing a portion of the partial layer, and repeating the application and removal steps until the liner sidewall conforms to the serrated sidewall in the substrate and has a sufficiently roughened surface.

The step of applying the conductive fill may further comprise applying a seed layer over the liner and then applying the conductive fill over the seed layer, the seed layer and the conductive fill comprising similar conductive materials. The step of applying the seed layer may comprise applying a partial seed layer of the conductive material over the liner, removing a portion of the partial seed layer, and repeating the application and removal steps until the seed layer is sufficiently deposited in conformance to the liner.

The invention also comprises a method for enhancing adhesion between one or more layers of a damascene structure in a substrate. The method comprises creating the damascene structure with a roughened sidewall in the substrate. The damascene structure may further have a smooth bottom and, optionally, a liner over the roughened sidewall and smooth bottom, the liner having a roughened surface over the sidewall and smooth surface over the bottom. The method may further comprise disposing conductive material over the liner. The conductive fill may be applied by first applying a seed layer over the liner, the seed layer comprising a thin layer of the conductive material, and then depositing a remainder of the conductive material over the seed layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4B shows a perspective, partial cross-section of the substrate of FIG. 4A after photoresist development;

FIG. 4C shows a cross-section of the substrate of FIG. 4B after an etching step;

FIG. 4D shows a cross-section of the substrate of FIG. 4C after deposition of the liner;

FIG. 4E shows a cross-section of the substrate of FIG. 4D after deposition of a seed layer; and FIG. 4F shows a cross-section of the substrate of FIG. 4E after deposition of conductive fill and before a planarization step.

DETAILED DESCRIPTION OF THE INVENTION

A damascene process is a process used in some aspects of semiconductor fabrication. It is a process of inlaying a metal into a predefined pattern, typically in a dielectric layer. The process is typically performed by defining the desired pattern into a dielectric film; depositing metal over the entire surface by either physical vapor deposition, chemical vapor deposition, or evaporation; then polishing back the top surface in such a way that the top surface is planarized and the metal pattern is only located in the predefined regions of the dielectric layer. The damascene process has been used in manufacturing of metal wiring lines, including the bit-lines for a dynamic random access memory (DRAM) capacitor.

Damascene technology is a common method of fabricating interconnects. In this context, damascene refers to the steps of patterning an insulator to form recesses, filling the recesses with a metal, and then removing the excess metal above the recesses. This process can be repeated as needed to form the desired number of stacked interconnects. Typically, these damascene structures are laid out in pairs, a process referred to as dual damascene. The present invention constitutes an improved damascene structure and an improved process for making such a structure. The improvements are best explained using the equations outlined above.

By substituting equation 3 into equation 9, the relationship between the tensile stress and the adhesion stress may be rewritten as:

$$\tau_v = \frac{\sigma_v}{\frac{A_c}{A_b}+1} \quad (13)$$

Similarly, substitution of equation 7 into equation 12, provides:

$$\tau_L = \frac{\sigma_L}{1+\frac{A_w}{A_f}} \quad (14)$$

In either case, an increase in the circumferential sidewall surface area $A_c$ or the sidewall surface area $A_w$ results in a decreased adhesion stress, and thus a smaller adhesion force necessary at the corresponding interfaces to prevent de-lamination.

Figure 3:
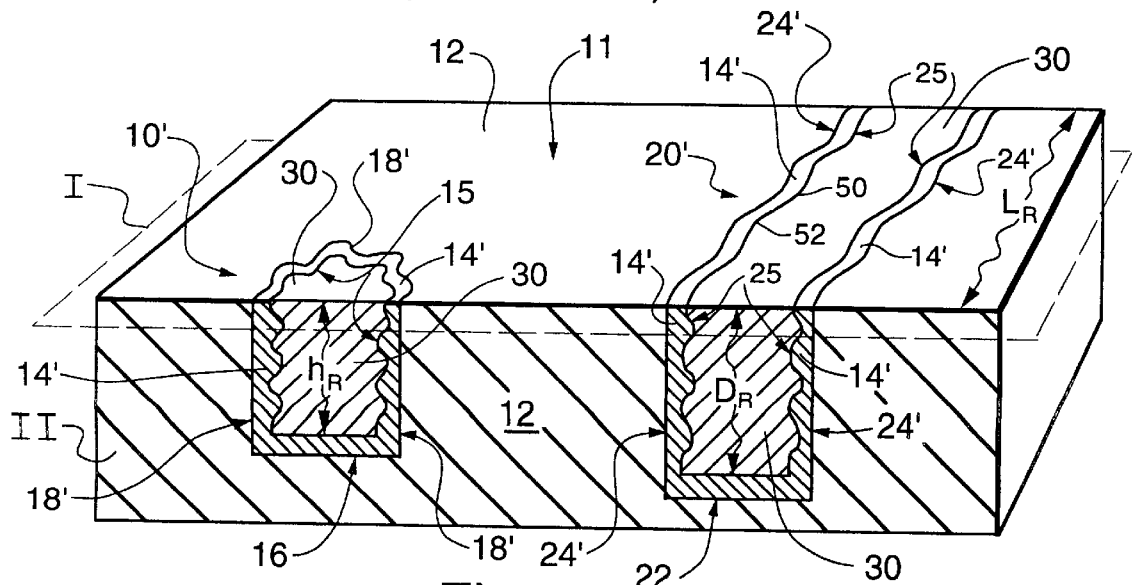
FIG. 3 is a perspective, partial cross-sectional view of an exemplary via and line according to the present invention.

Referring now to FIG. 3, there is shown a partial cross section, partial perspective view of a via 10' and a line 20' of the present invention in which sidewalls 18' and 24' are roughened. (Although not shown in FIG. 3, corresponding sidewalls 23' may also be roughened.) In particular, as illustrated in the exemplary embodiment shown in FIG. 3, sidewalls 18' and 24' each comprise a pattern of serrations having coplanar peaks 50 and valleys 52 along planar surface 11. This serrated pattern also extends into substrate 12 such that any longitudinal section (such as along plane I) of via 10' or line 20' parallel to surface 11 also has the same, regular serrated pattern of peaks 50 and valleys 52. By a "regular" serrated pattern is meant that a comparison of any two longitudinal section planes reveals peaks 50 and valleys 52 aligned with one another from plane to plane.

Liner 14' in via 10' and line 20' also has roughened sidewalls 15 and 25, respectively. The roughness in liner 14' may comprise not only serrations extending along longitudinal section planes parallel to the plane of surface 11 (in conformance with serrated sidewalls 18' and 24'), but also serrations extending along cross-sectional planes such as cross-sectional plane II shown in FIG. 3. The serrations of liner 14' along cross-sectional planes are typically not in a regular pattern (i.e., a comparison of two cross-sectional planes typically does not reveal aligned peaks 50 and valleys 52). In fact, whenever liner 14' is roughened along both longitudinal section and cross section planes, a comparison, the pattern in both planes is typically irregular, as the irregularity in the cross-sectional plane disrupts any regularity in the longitudinal section plane. The serrations in liner 14' may also comprise a regular pattern of peaks 50 and valleys 52 in some cases, however, particularly when the liner serrations merely conform to serrations in sidewall 15 or 25 without serrations in the cross-sectional planes.

The roughened liner sidewalls, by virtue of their wavy shape, create greater surface area. For instance, the effective length $L_R$, height $h_R$, and depth $D_R$ of liner 14' as shown in FIG. 3 may be two-to-three times greater than the effective length, height, and depth of corresponding smooth-walled liners over smooth sidewalls. Such increases in $h_R$ and $D_R$ linearly increase corresponding ratios $A_c/A_b$ and $A_w/A_f$, assuming a constant d and W, and thus proportionately decrease $\tau_v$ and $\tau_L$.

The selectively increased surface roughness of liner roughened sidewalls 15 and 25 not only increases surface area, but also creates micro-interlocking structures on the sidewalls. Bottom 16 and floor 22 may be left unroughened, creating a "dual microstructure liner." The "dual microstructure" refers to the roughened microstructure on the vertical roughened sidewalls 15 and 25 of liner 14' of via 10' and line 20', respectively, as compared to the smooth microstructure on bottom 16 and floor 22 of liner 14', respectively. Via 10' and line 20' may be filled with conductive fill or metal 30, such as copper, as shown in FIG. 3.

Figure 4A:
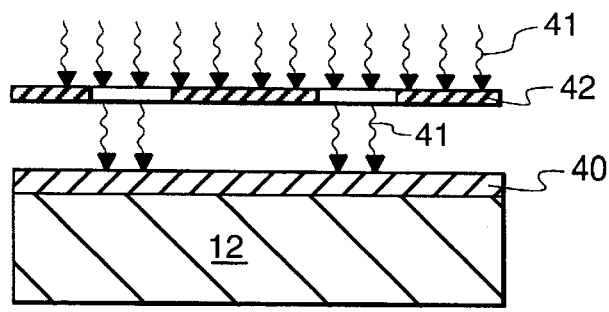
FIGS. 4A through 4F are cross-sectional and perspective, partial cross-sectional illustrations of an exemplary process for manufacture of an exemplary via and line of the present invention with FIG. 4A showing a cross-section of a substrate undergoing a photoresist exposure step.
Figure 4B:
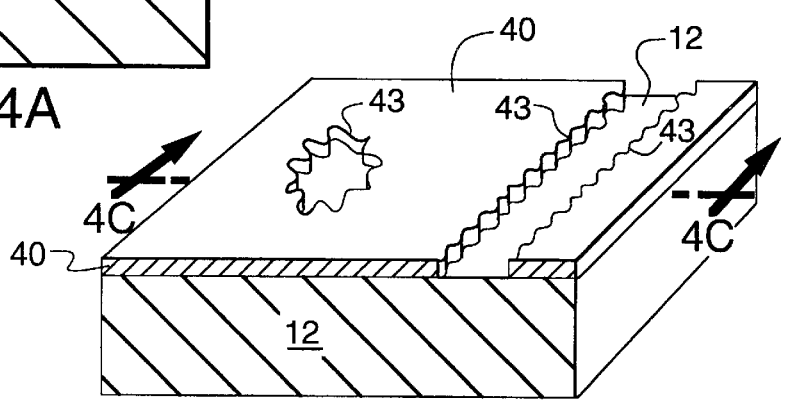

Referring now to FIGS. 4A through 4F, there is illustrated an exemplary process for creating the roughened sidewalls of the present invention. First, photoresist 40 is deposited on substrate 12 as shown in FIG. 4A. Photoresist 40 and substrate 12 comprise any of the standard materials well known in the art. An illumination source (not shown) shines illumination 41 through a patterned mask 42 under exposure conditions chosen to create a standing wave in photoresist 40 during resist exposure.

The creation of standing waves is known in the art and is described generally, for example, in Wayne M. Moreau, *Semiconductor Lithography Principles Practices, and Materials,* pages 373-75 (Plenum Press, New York, 1988). Standing waves are produced as a result of interference wave reflections from the resist-substrate interface, and are present at:

$$\frac{2N\lambda}{2n} \quad (15)$$

where:

$\lambda$=wavelength of illumination 41, n=index of refraction of photoresist 40, and N=an integer.

Figure 1:
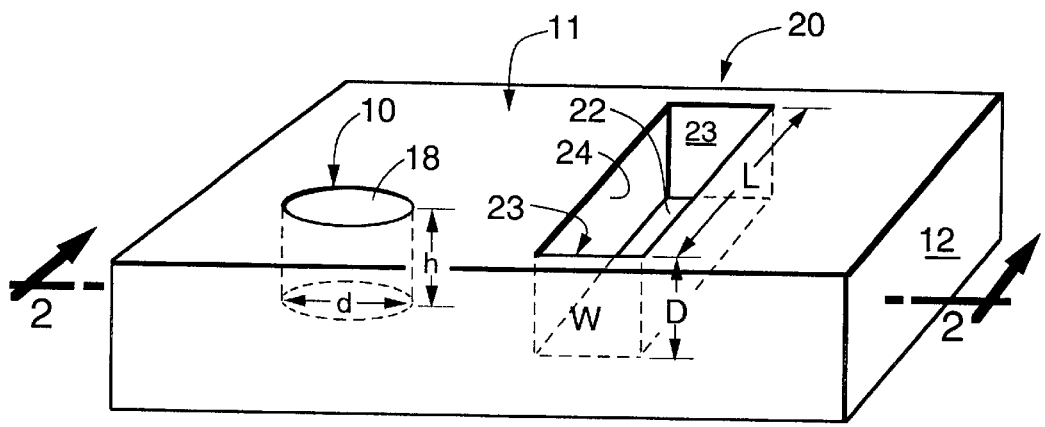
FIG. 1 is a perspective view of a typical via and line in a substrate as are known in the prior art.
Figure 2:
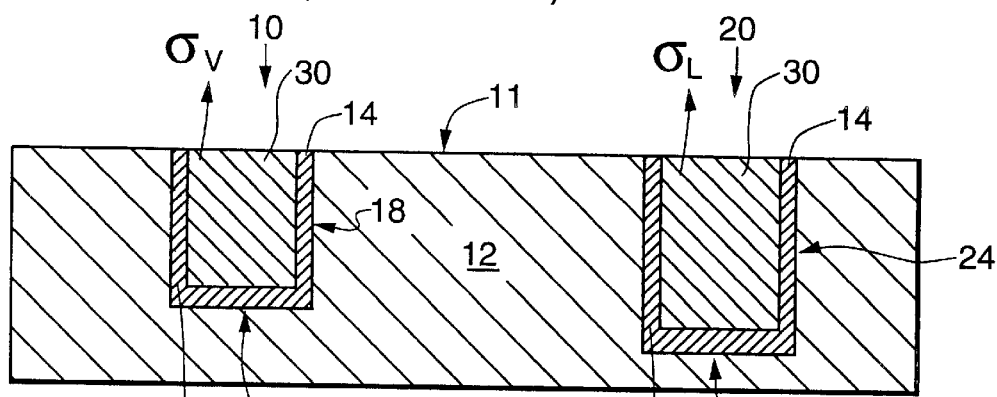
FIG. 2 is a cross-sectional view of the via and line taken along the line 2—2 of FIG. 1.

Thus, photoresist 40 (having a known index of refraction) and the wavelength of the exposure source can be optimized to provide a standing wave during exposure, whereas normally standing waves are avoided to provide maximum line resolution. The standing wave creates a serrated pattern in photoresist 40 having a reticulated or wavy edge 43, shown in FIG. 4B after development of photoresist 40, unlike straight sidewalls 18 and 24 as shown in FIG. 1 created by typical exposure conditions.

Figure 4C:
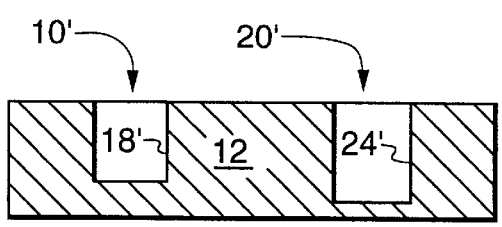

The serrated pattern is then transferred into substrate 12 by RIE, creating via 10' and line 20' as shown in FIG. 4C. Although sidewalls 18' and 24' are serrated along the plane of surface 11 of substrate 12, the cross-sectional profile of the sidewalls along the depth of via 10' and line 20' as etched by traditional RIE processes is still straight.

Figure 4D:
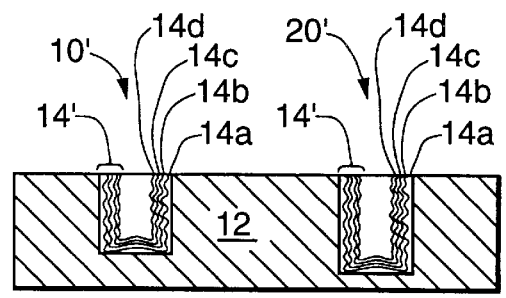

Barrier layer or liner 14' is then deposited in via 10' and line 20' as shown in FIG. 4D. For example, a liner 14' of tantalum, titanium, or tungsten may be deposited by chemical vapor deposition (CVD) for use with copper lines. To ensure good liner coverage, liner 14' may be deposited by using multiple deposition and sputtering processes. Such a multiple deposition process not only conforms liner 14' to the serrations of the sidewall along a longitudinal section, but may also provide serrations in the cross-sectional plane perpendicular to the top surface of substrate 12, as shown in FIG. 4D.

As shown in FIG. 4D, an initial thin layer 14a of liner material is deposited, for instance having a thickness of 300 Angstroms, after which about 40% to about 80% of the deposited initial thin layer 14a is sputtered off. This deposition and sputtering process is repeated typically more than once. Thus, liner 14' may comprise four thin layers 14a, 14b, 14c, and 14d, as shown in FIG. 4D for example, having roughened sidewalls 15 and 25. Globular deposition conditions, as are known in the art, such as a PVD sputtering technique, may be chosen in the deposition steps to further enhance the roughness of deposited liner 14'. In the alternative, a single deposition process may be used if it is only desired to conform liner 14' to the serrations of the sidewall without adding additional roughness in the cross-sectional profile.

Figure 4E:
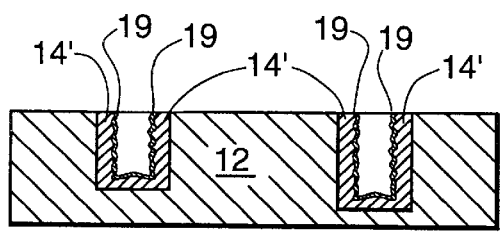
Figure 4F:
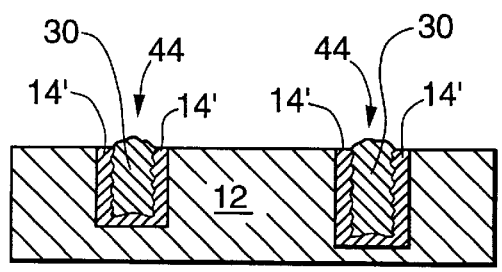

A similar deposition and sputtering process may be used to deposit a seed layer 19 of conductive material, as shown in FIG. 4E, before filling via 10' and 20' with conductive fill or metal 30 as shown in FIG. 4F. Seed layer 19 typically comprises the same conductive material as fill or metal 30, such as copper, and is used to improve adherence of the conductive fill or metal 30 to liner 14' on sidewalls 15 and 25. Conductive fill or metal 30 may be applied by electroplating in a suitable Cu plating bath, for example, or may be applied by CVD or PVD methods or combinations of such methods, as are known in the art. After deposition of conductive fill or metal 30, any metal overburden 44 is typically planarized by a chemical mechanical polishing (CMP) process or any process known in the art, to produce the completed via 10' and line 20' as shown in FIG. 3.

The micro-interlocking sidewall structure created by the present invention enhances the structural integrity of the metal-substrate interface by increasing surface area for improved adhesion. The roughened sidewall not only provides better chemical adhesion, but also mechanically anchors the conductive metal to the sidewall. Furthermore, the roughened sidewalls also provide resistance to electron migration. The smooth bottom structure is preferred for minimized contact resistance and current crowding at the via-line interface. Thus, the dual microstructure liner provides excellent de-lamination resistance while in turn enhancing electro-migration properties. Although the properties of and process for making the damascene structure of the present invention are particularly useful for copper vias and lines, such a structure and process are equally applicable to other conductive fills as well, including, for example, aluminum.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A damascene structure disposed in an insulating substrate, wherein the substrate has a surface defining a first plane, the structure comprising:

a substrate sidewall extending in a second plane substantially perpendicular to the first plane;

a bottom extending in a third plane substantially parallel to the first plane;

a liner completely covering said sidewall and said bottom, said liner having a roughened surface with a regular serration pattern of alternating peaks and valleys extending in a plane parallel to the substrate surface; and a conductive fill on said liner and in contact with said roughened surface of said liner.

2. The damascene structure of claim 1 wherein said roughened surface comprises two intersecting serration patterns.

3. The damascene structure according to claim 2 wherein said serration patterns intersect at substantially 90 degrees.

4. The damascene structure according to claim 1 wherein said roughened surface of said liner further comprises a serrated pattern along a cross section intersecting said substrate surface.

5. The damascene structure according to claim 1 wherein the sidewall has a roughened surface with a plurality of serrations in contact with said liner.

6. The damascene structure according to claim 5 wherein said substrate has a surface and said roughened sidewall surface comprises a serrated pattern along a longitudinal section parallel to said substrate surface.

7. The damascene structure of claim 5 wherein the bottom of said structure is smooth.

8. The damascene structure of claim 1 wherein said liner has a smooth surface over said bottom.

9. The damascene structure of claim 1 wherein the structure is one of a via and a line.

10. The damascene structure of claim 1 wherein the conductive fill is one of copper and aluminum.

11. The damascene structure of claim 1 wherein the liner is one of tantalum, titanium, and tungsten.

12. The damascene structure of claim 1 that is a bit line for a dynamic random access memory capacitor.

* * * * *